(12) United States Patent
Liao et al.

(10) Patent No.: US 7,601,586 B2
(45) Date of Patent: Oct. 13, 2009

(54) METHODS OF FORMING BURIED BIT LINE DRAM CIRCUITRY

(75) Inventors: Ann K. Liao, Boise, ID (US); Michael J. Westphal, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/637,298

(22) Filed: Dec. 12, 2006

(65) Prior Publication Data

US 2007/0087498 A1 Apr. 19, 2007

Related U.S. Application Data

(63) Continuation of application No. 11/217,539, filed on Sep. 1, 2005, now Pat. No. 7,148,102, which is a continuation of application No. 10/302,360, filed on Nov. 22, 2002, now Pat. No. 6,939,761.

(51) Int. Cl.
*H01L 21/8244* (2006.01)

(52) U.S. Cl. ............... 438/241; 438/702; 257/E21.206; 257/E21.488

(58) Field of Classification Search ................. 438/241, 438/364, 253, 702; 257/E21.59, E21.488, 257/E21.206
See application file for complete search history.

(56) References Cited

U.S. PATENT DOCUMENTS

| | | | | |
|---|---|---|---|---|
| 5,635,423 A | 6/1997 | Huang et al. | ................. | 438/725 |
| 5,668,036 A * | 9/1997 | Sune | ........................... | 438/253 |
| 5,858,833 A | 1/1999 | Lee et al. | ..................... | 438/253 |
| 6,008,084 A | 12/1999 | Sung | ........................... | 438/241 |
| 6,071,799 A * | 6/2000 | Park et al. | .................... | 438/595 |
| 6,130,102 A | 10/2000 | White et al. | ................... | 438/3 |
| 6,255,160 B1 * | 7/2001 | Huang | ......................... | 438/253 |
| 6,329,234 B1 | 12/2001 | Ma et al. | ..................... | 438/210 |
| 6,329,682 B1 | 12/2001 | Parekh et al. | ............... | 257/306 |
| 6,355,520 B1 | 3/2002 | Park et al. | .................... | 438/253 |
| 6,403,424 B1 | 6/2002 | Lee et al. | ..................... | 438/280 |
| 6,429,928 B2 | 8/2002 | Johnson et al. | ............... | 356/72 |
| 6,544,850 B1 * | 4/2003 | Schnabel et al. | ............ | 438/286 |
| 6,767,788 B2 | 7/2004 | Kim | ........................... | 438/253 |
| 6,809,027 B2 | 10/2004 | Strane et al. | ................ | 438/637 |
| 2002/0151134 A1 * | 10/2002 | Kunikiyo | .................... | 438/254 |

OTHER PUBLICATIONS

C. Kaanta, et al. "Issues in a submicron interconnect system" 1991 Proc. Eighth International IEEE VLSI Multilevel Interconnection conf. pp. 137-152(1991).*

* cited by examiner

*Primary Examiner*—Caridad M Everhart
(74) *Attorney, Agent, or Firm*—Wells St. John P.S.

(57) ABSTRACT

A method of forming buried bit line DRAM circuitry includes collectively forming a buried bit line forming trench, bit line vias extending from the bit line forming trench, and memory array storage node vias within a dielectric mass using only two masking steps. Conductive material is simultaneously deposited to within the buried bit line forming trench, the bit line vias, and the memory storage node vias within the dielectric mass. Other aspects and implementations are contemplated.

20 Claims, 8 Drawing Sheets

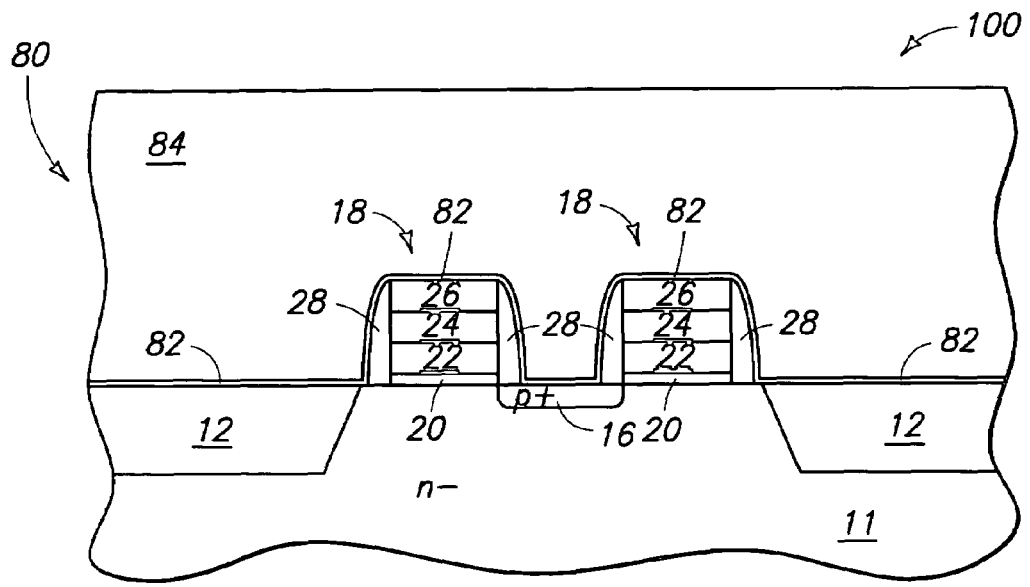
F I G 5
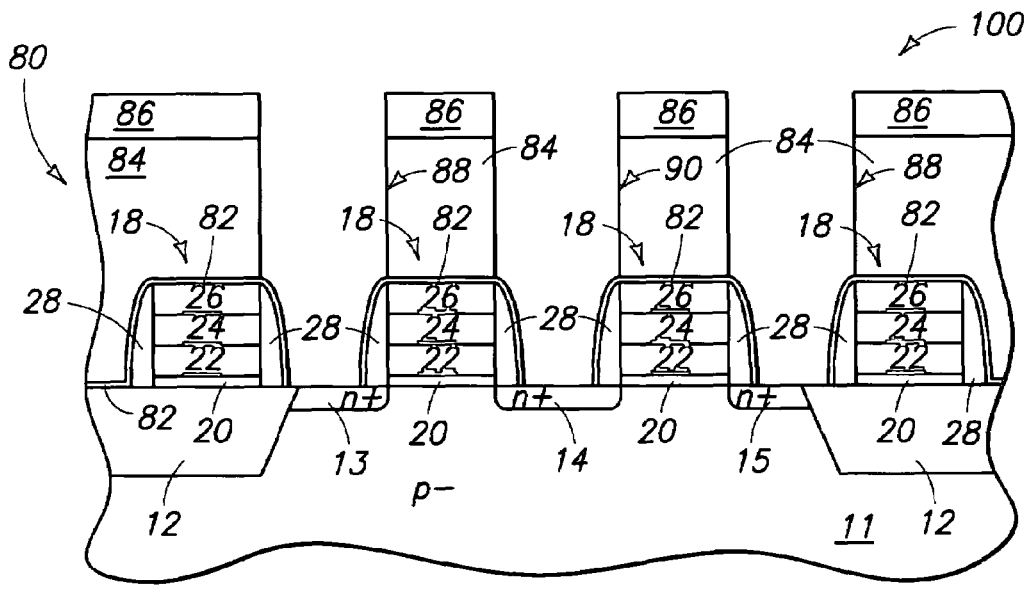
F I G 6

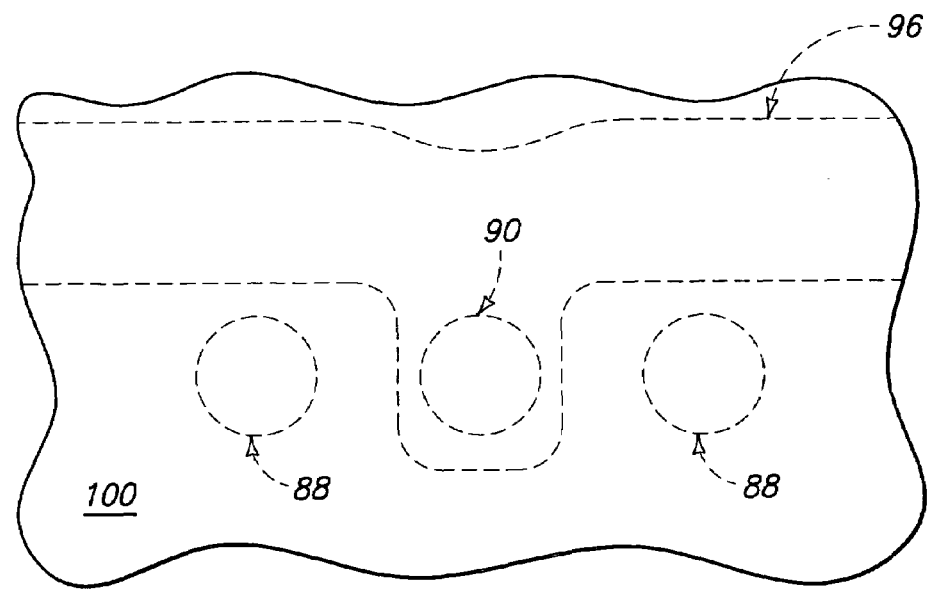
$\mathbb{F}\mathbb{I}\mathbb{G}$ 13
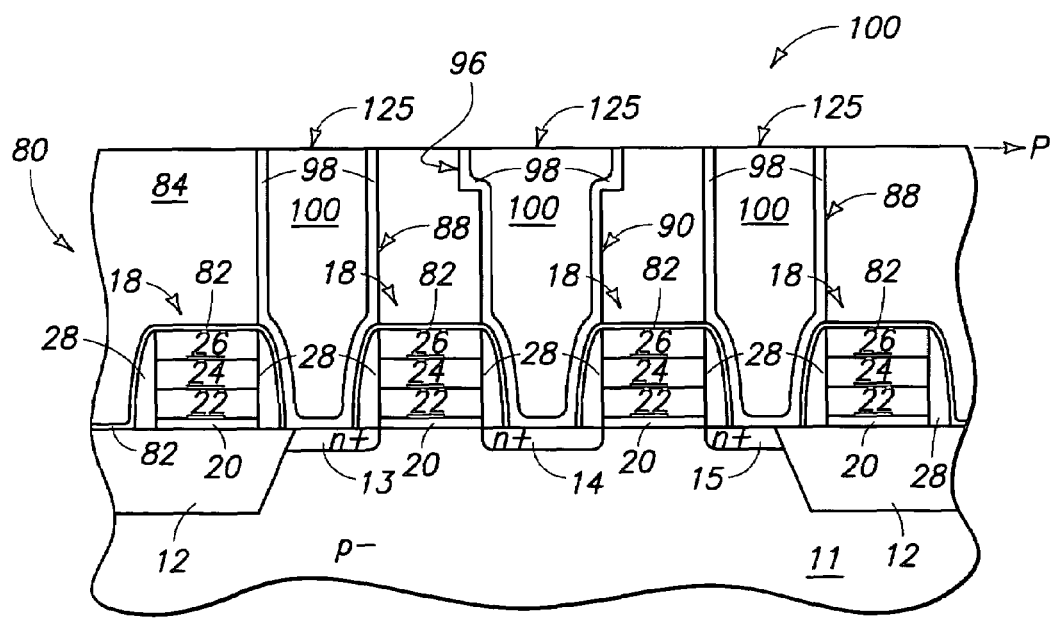
$\mathbb{F}\mathbb{I}\mathbb{G}$ 14

METHODS OF FORMING BURIED BIT LINE DRAM CIRCUITRY

RELATED PATENT DATA

This patent resulted from a continuation application of U.S. patent application Ser. No. 11/217,539, filed Sep. 1, 2005, entitled "Methods of Forming Buried Bit Line DRAM Circuitry", naming Ann K. Liao and Michael J. Westphal as inventors, now U.S. Pat. No. 7,148,102 the disclosure of which is incorporated by reference; which patent resulted from a continuation application of U.S. patent application Ser. No. 10/302,360, filed Nov. 22, 2002, entitled "Methods of Forming Buried Bit Line DRAM Circuitry", naming Ann K. Liao and Michael J. Westphal as inventors, now U.S. Pat. No. 6,939,761 the disclosure of which is incorporated by reference.

TECHNICAL FIELD

This invention relates to methods of forming buried bit line DRAM circuitry.

BACKGROUND OF THE INVENTION

An exemplary prior art method of forming buried bit line DRAM circuitry, and issues associated therewith, is described with reference to FIGS. 1-3. FIGS. 1 and 2 depict circuitry fabrication relative to a memory array, whereas FIG. 3 depicts circuitry fabrication relative to peripheral circuitry which is not within the memory array. A wafer fragment 10 comprises an exemplary bulk monocrystalline substrate 11, for example bulk monocrystalline silicon. Exemplary shallow trench isolation regions 12 are shown formed relative to substrate 11. Within the memory array, exemplary n+ diffusion regions/storage node locations 13 and 15 are formed. An n+ diffusion region/bit line node 14 is also illustrated. A p+ peripheral node 16 is illustrated relative to the peripheral circuitry (FIG. 3). Background doping within the substrate 11 region of FIG. 1 would typically be p−, while that of FIG. 3 would typically be n−.

Exemplary word line/gate line/conductive interconnects 18 are illustrated. Preferred constructions for the same include a gate dielectric layer 20, a conductively doped polysilicon layer 22, a conductive metal silicide layer 24 and an insulative cap 26. Insulative sidewall spacers 28 are also illustrated as comprising a portion of gate constructions 18.

A thin, undoped silicon dioxide layer 30 has been deposited over the substrate. An example material is silicon dioxide deposited by decomposition of tetraethylorthosilicate (TEOS). Another insulating layer 31 has been deposited thereover, with an example being doped silicon dioxide, such as borophosphosilicate glass (BPSG). Such has been planarized, as shown, for example by chemical mechanical polishing (CMP).

A photolithographic masking and etch step is then conducted to form storage node vias 32 and bit line via 34 in a common masking and in one or more common etching steps. A buried contact implant can then be provided, if desired, to within the typically previously formed diffusion regions 13, 14 and 15. Then, n+ polysilicon 36 is provided, typically by in situ doping during deposition, to overfill openings 32 and 34. Such can then be dry etched or CMP'd back to provide the illustrated isolated plugs 36 within openings 32 and 34.

Next, an exemplary illustrated peripheral circuit via 38 is etched within insulative mass 31/30 (FIG. 3). Then, p+ polysilicon 40 is provided within opening 38, typically by in situ doping during deposition. Such polysilicon is then CMP'd or otherwise planarized back to form an isolated plug within peripheral circuitry via 38.

Thereafter, a thin undoped silicon dioxide layer 42 is deposited, preferably by the decomposition of TEOS. Then, photolithographic patterning and oxide etch are conducted to form opening 44 to the bit contact plugging material 36 within bit line via 34. During this step, or more typically at a later step in the process, openings 47 (FIG. 3) are also formed within undoped silicon dioxide layer 42 relative to the peripheral p+ plugging material 40 received within peripheral vias 38.

Metal materials 46 and 48 are blanketly deposited over the substrate. Preferably, material 46 comprises a composite of a physical vapor deposited titanium rich titanium nitride material followed by physical vapor deposition of stoichiometric tungsten nitride. Typically, layer 48 is then deposited by chemical vapor deposition to principally comprise elemental tungsten. An insulative capping layer 51 might also be provided. Metal materials 46 and 48 are subjected to a photolithographic masking and subtractive etching step to form the illustrated buried bit line 52. Nitride spacers 54 can be provided by deposition and anisotropic etch.

Then, another BPSG layer 56 is deposited. Such can be by rapid thermal processing and reflow, or any other process. Nitride can also be etched from the backside of the substrate at this point. The BPSG can then be CMP'd or otherwise planarized back. Another photolithographic masking step and patterning can then be conducted to form the illustrated openings 58 and 60 within insulative materials 56 and 42 to the illustrated material 36 within openings 32, and material 40 within opening 38. Thereafter, conductive plugging material 62 (i.e., conductively doped polysilicon) is provided within openings 58 and 60, and then etched or otherwise planarized back. Subsequent processing is then conducted to form capacitor constructions in electrical contact with material 62 within the array.

Full formation of the contacting plugs to conductive nodes 13, 14, 15 and 16, including the fabrication of the buried bit line, in the above-described process uses five different masking steps, as well as a plethora of deposition steps and dry etch processing. It would be desirable to minimize this complexity and number of steps.

While the invention was motivated in addressing the above issues and improving upon the above-described drawbacks, it is in no way so limited. The invention is only limited by the accompanying claims as literally worded (without interpretative or other limiting reference to the above background art description, remaining portions of the specification, or the drawings), and in accordance with the doctrine of equivalents.

SUMMARY

The invention includes methods of forming buried bit line DRAM circuitry. In one implementation, a method of forming buried bit line DRAM circuitry includes collectively forming a buried bit line forming trench, bit line vias extending from the bit line forming trench, and memory array storage node vias within a dielectric mass using only two masking steps. Conductive material is simultaneously deposited to within the buried bit line forming trench, the bit line vias, and the memory storage node vias within the dielectric mass.

In one implementation, a method of forming buried bit line DRAM circuitry includes forming an insulative mass over a substrate. A plurality of via openings are formed through the insulative mass to conductive node locations. At least one of the conductive node locations is a memory array bit line node. At least one of the conductive node locations is a memory array storage node. After forming the plurality of via openings, at least one bit line forming trench is formed within the insulative mass. The bit line forming trench overlies the one via to the memory array bit line node. Conductive material is deposited to within the buried bit line forming trench, the one via to the memory array bit line node, and the one via to the memory array storage node.

In one implementation, a method of forming buried bit line DRAM circuitry includes forming a conductively interconnected mass of conductive material which comprises a bit line, a contact to a memory array storage node, and a contact to a bit line node. The mass has an outer region. A quantity of the outer region of the conductively interconnected mass of conductive material is removed effective to form a bit line in electrical connection with the bit line contact which is electrically isolated from the contact to the memory array storage node.

Other aspects and implementations are contemplated.

BRIEF DESCRIPTION OF THE DRAWINGS

Preferred embodiments of the invention are described below with reference to the following accompanying drawings.

FIG. 2 is a top view of a portion of FIG. 1.

FIG. 1 is diagrammatic sectional view taken through line 1-1 in FIG. 2.

FIG. 3 is a diagrammatic sectional view of another portion of the FIG. 1 substrate.

FIG. 5 is a diagrammatic section view of the substrate of FIG. 4 taken outside the memory array and relative to peripheral circuitry.

FIG. 6 is a view of the FIG. 4 fragment at a processing point subsequent to that of FIG. 4.

FIG. 13 is a diagrammatic top view of FIG. 11.

FIG. 14 is a view of the FIG. 11 fragment at a processing point subsequent to that of FIG. 11.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 4:
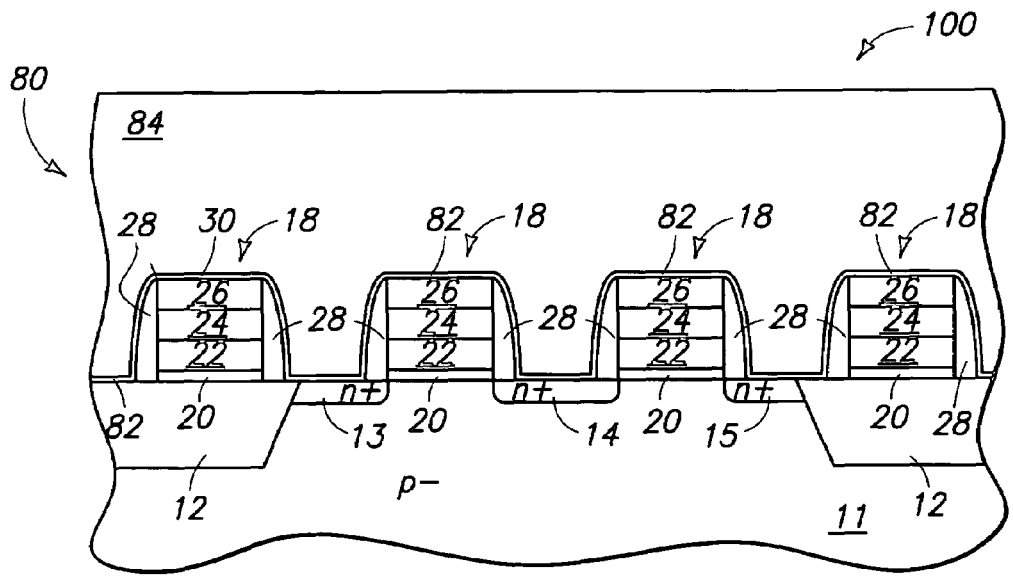
FIG. 4 is a diagrammatic section view of a portion of a memory array of a semiconductor substrate at one processing point in accordance with an aspect of the invention.

Exemplary preferred methods of forming buried bit DRAM circuitry are described with reference to FIGS. 4-16. Referring initially to FIGS. 4 and 5, a wafer fragment or substrate is indicated generally with reference numeral 100. Like numerals from the prior art embodiment described above are utilized where appropriate, with differences or additional emphasis being indicated with different numerals. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of this document, the term "layer" encompasses both the singular and the plural unless otherwise indicated.

Diffusion regions 13, 14, 15 and 16 constitute exemplary conductive node locations. Node locations 13 and 15 comprise memory array storage nodes. Diffusion region 14 constitutes a memory array bit line node. Diffusion region 16 comprises a peripheral circuitry node. An insulative mass 80 is formed as part of the illustrated substrate. By way of example only, such preferably comprises an undoped silicon dioxide layer 82 deposited by the decomposition of TEOS, and an overlying BPSG layer 84. An exemplary thickness for layer 82 is 200 to 300 Angstroms, while an exemplary thickness for layer 84 is 3000 Angstroms. Preferably, mass 80 is processed to have a planarized outer surface as shown, for example by chemical mechanical polishing or any other existing or yet-to-be developed techniques.

Figure 7:
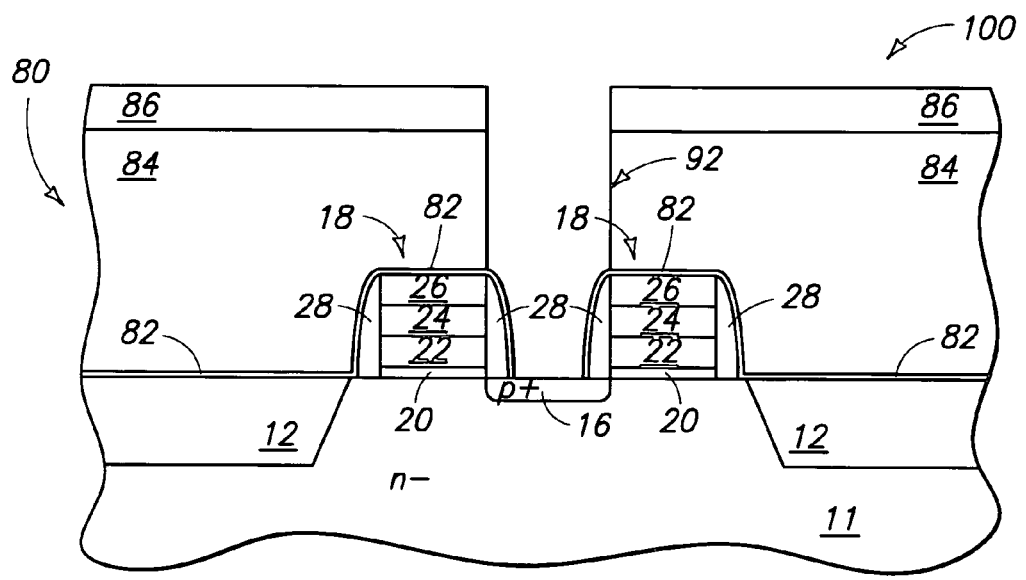
FIG. 7 is a view of the FIG. 5 fragment at a processing point subsequent to that of FIG. 5 and corresponding to that of FIG. 6.
Figure 8:
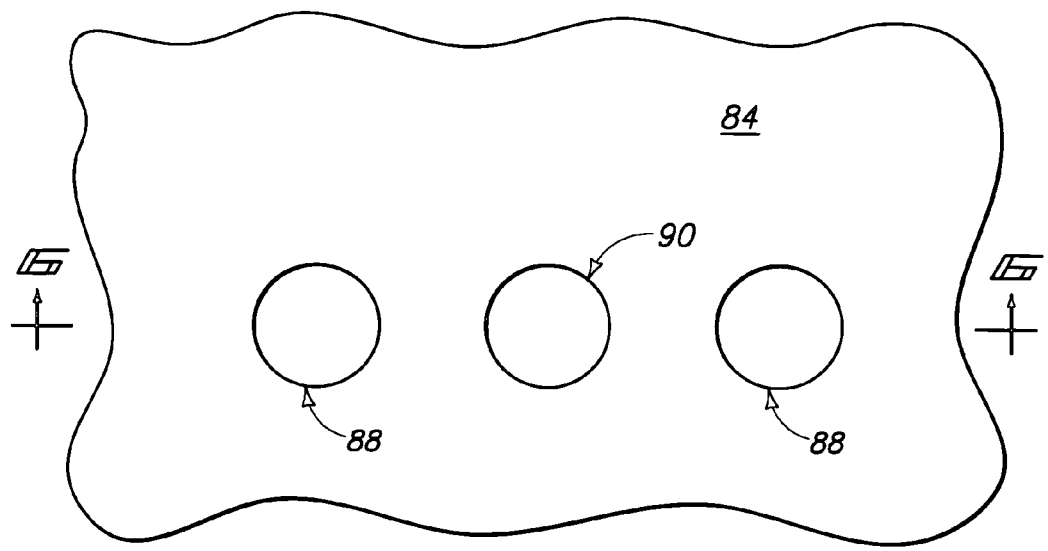
FIG. 8 is a diagrammatic top view of FIG. 6.

Referring to FIGS. 6-8, a masking layer 86 has been deposited and patterned. A preferred material for layer 86 is photoresist, although other materials, (including multiple materials) and with and without photosensitive materials, are also of course contemplated. A plurality of via openings has been formed through insulative mass 80 to the conductive node locations, typically and preferably by one or more conventional or yet-to-be-developed etching techniques. In the illustrated example as shown in FIG. 6, via openings 88 are etched to memory array storage node locations 13 and 15, with via opening 90 being etched to memory array bit line node 14. Also in the most preferred embodiment utilizing the illustrated masking layer 86, and correspondingly in the same masking step, periphery circuitry vias are also formed, for example via 92 to exemplary peripheral circuitry node 16.

Figure 9:
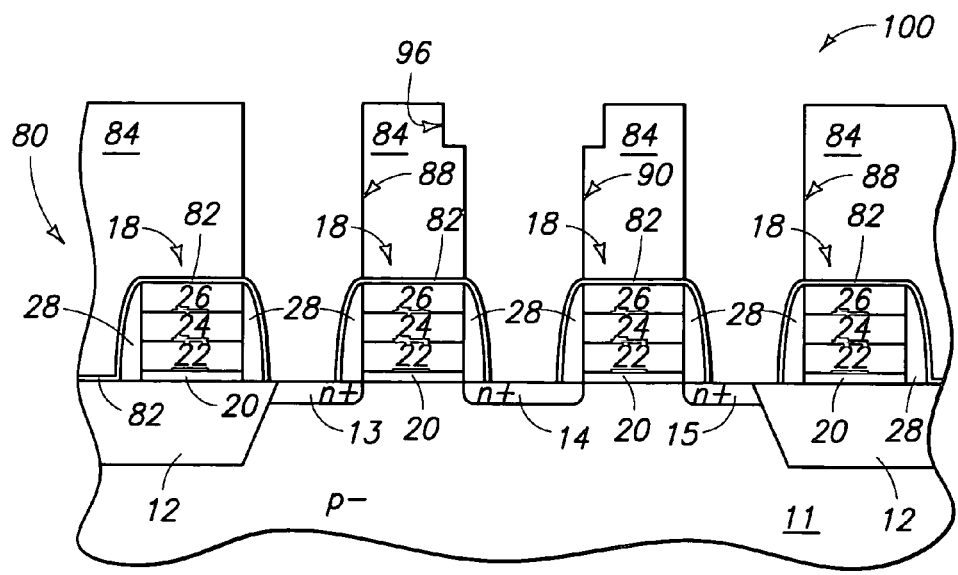
FIG. 9 is a view of the FIG. 6 fragment at a processing point subsequent to that of FIG. 6.
Figure 10:
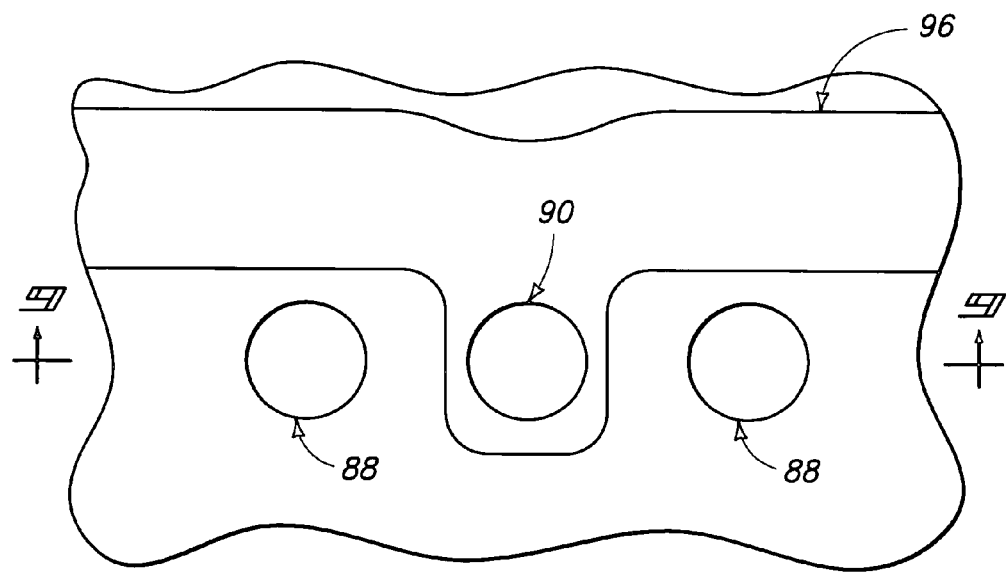
FIG. 10 is a diagrammatic top view of FIG. 9.

Referring to FIGS. 9 and 10, using another masking step, a bit line forming trench 96 is formed within insulative mass 80 to overlie via 90 to memory array bit line node 14. In the context of this document, a "bit line forming trench" constitutes a trench formed within a material to create at least a general global outline of a bit line being formed over the substrate. An example preferred technique for doing so is to utilize photolithographic masking and a timed etch, for example, to produce the illustrated FIGS. 9 and 10 outline.

The above processing describes and depicts but one example of collectively forming a buried bit line forming trench, bit line vias extending from the bit line forming trench and memory array storage node vias within a dielectric mass using only two masking steps, and which, in the preferred embodiment, comprises photolithography and etch. Such also forms, in one preferred embodiment, peripheral circuitry vias within the dielectric mass.

The above also depicts and describes but one exemplary method of forming buried bit line DRAM circuitry which includes forming a plurality of via openings through an insulative mass to conductive node locations on a substrate, with at least one of the conductive node locations being a memory array bit line node and at least one of the conductive node locations being a memory array storage node. At least one bit line forming trench is formed within the insulative mass after forming the plurality of via openings, with the bit line forming trench overlying the one via to the memory array bit line node. In such exemplary aspect, the forming of the plurality of via openings and the forming of the bit line forming trench comprises photolithography and etch. In one implementation, such photolithography and etch uses different masking steps, and more preferably only two different masking steps.

Figure 11:
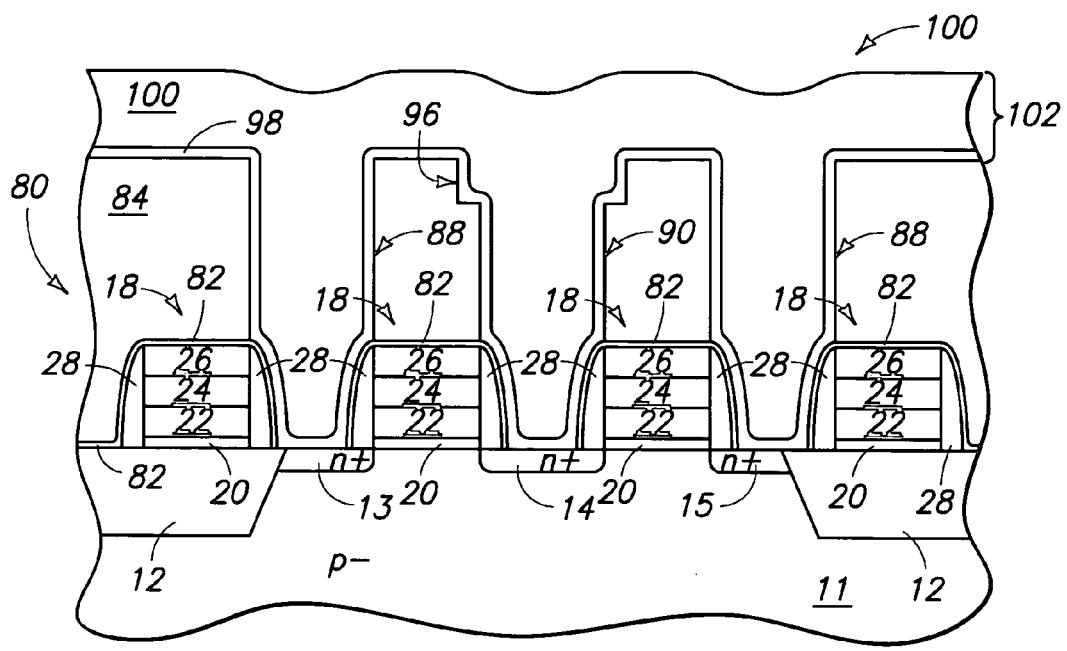
FIG. 11 is a view of the FIG. 9 fragment at a processing point subsequent to that of FIG. 9.
Figure 12:
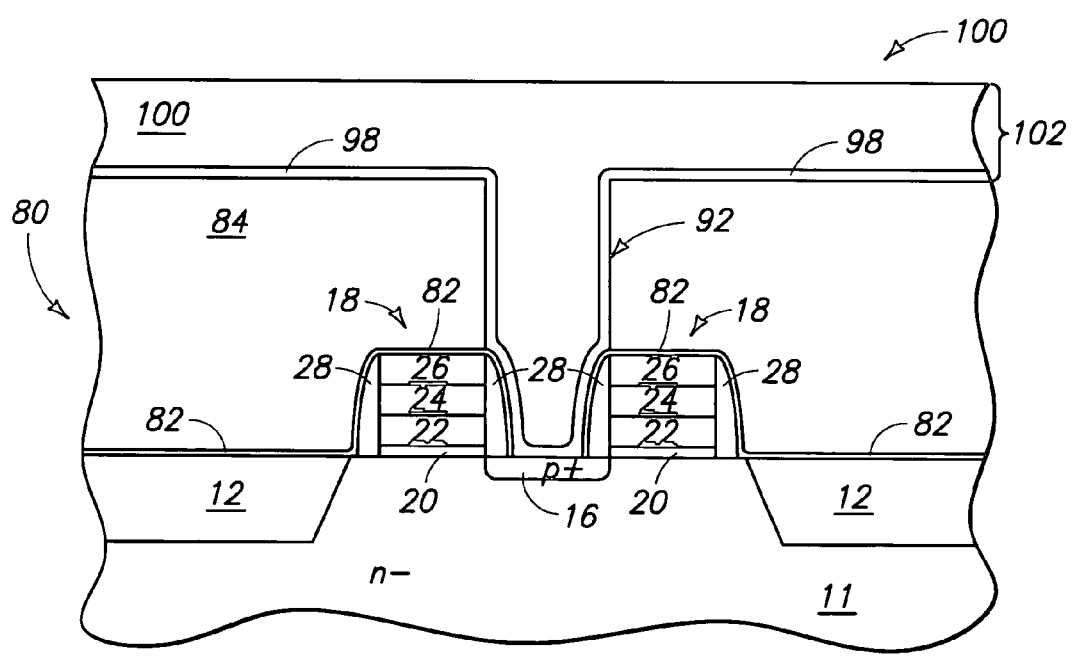
FIG. 12 is a view of the FIG. 7 fragment at a processing point subsequent to that of FIG. 7 and corresponding to that of FIG. 11.

Referring to FIGS. 11-13, conductive materials, for example depicted layers 98 and 100, are deposited to within buried bit line forming trench 96, vias 88 to memory array storage nodes 13 and 15, via 90 to memory array bit line node 14, and peripheral circuitry via 92 to peripheral circuitry node 16. Preferably as shown, at least some, and preferably all, of the depicted depositing occurs simultaneously into the respective vias and trenches. In one preferred implementation, the deposited conductive material comprises conductive metal. In the context of this document, "metal" is defined as at least one of metal in elemental form, at least two elemental metals in alloy form, or a metal compound. In one preferred implementation, all conductive material provided within the buried bit line forming trench, the bit line vias extending from the bit line forming trench and the memory array storage node vias consists essentially of conductive metal, with the resulting effect being to form conductive plugs and the bit line to consist essentially of conductive metal, as will be apparent from the continuing discussion.

In one preferred implementation, the conductive metal which is deposited comprises a metal compound and an elemental metal. In one preferred implementation, the conductive metal deposited comprises at least two, and more preferably at least three, different metals. For example, and by way of example only, conductive material 98 can be deposited to comprise a composite of a conductive tungsten, an overlying nitrogen-containing material/compound, and an overlying elemental titanium or a titanium enriched titanium nitride material/compound. Further by way of preferred example only, layer 100 can be deposited to comprise or consist essentially of elemental tungsten.

In another considered aspect or implementation, FIGS. 11-13 depict but one exemplary method of forming a conductively interconnected mass 98/100 which comprises a bit line, a contact to a memory array storage node and a contact to a bit line node. For purposes of the continuing discussion, conductively interconnected mass 98/100 can be considered as having an outer region, for example outer region 102. Further considered, the collective depositing of materials 98/100 can be considered as overfilling buried bit line forming trench 96, memory array storage node vias 88 and peripheral circuitry via 92. Further in one considered aspect or implementation, the illustrated forming of a conductively interconnected mass of conductive material occurs in at least one deposition, more preferably in at least two depositions and most preferably in the exemplary preferred embodiment in at least three depositions, which is/are common to form the conductive material in all of the bit line, contact to the bit line node, contact to the memory array storage node and contact to the peripheral circuitry node.

Figure 15:
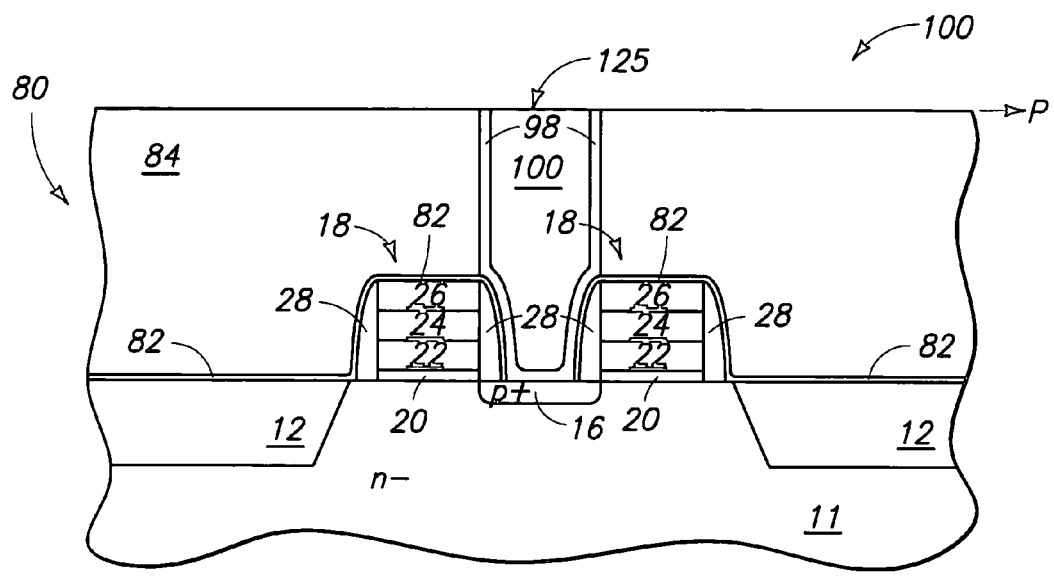
FIG. 15 is a view of the FIG. 12 fragment at a processing point subsequent to that of FIG. 12 and corresponding to that of FIG. 14.
Figure 16:
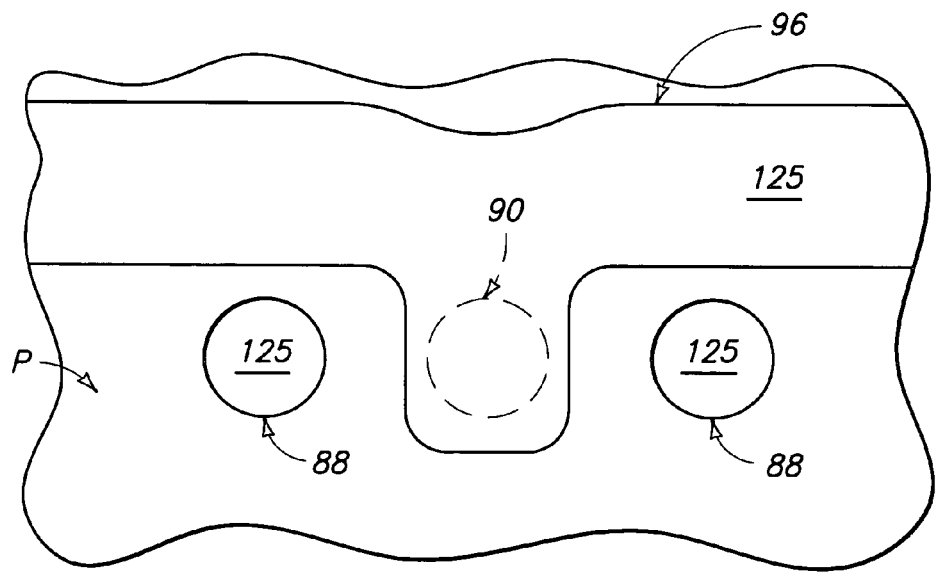
FIG. 16 is a diagrammatic top view of FIG. 14.

Referring to FIGS. 14-16, some quantity of the outer region, for example all of the previously depicted outer region 102, of the conductively interconnected mass is removed at least to the insulative mass 80 effective to electrically isolate the bit line from the contacts to the memory array storage nodes, and from the contacts to the peripheral circuitry. An exemplary preferred process for the removing comprises chemical mechanical polishing. Of course, other techniques, for example blanket etch back/resist etch back, or any other existing or yet-to-be-developed removing methods are also contemplated. In the illustrated preferred embodiment, the removing preferably forms discontinuous outer surfaces 125 of the deposited conductive material which, as shown, lies in a common plane, for example a plane "P". Of course, subsequent insulative and/or barrier layers can be provided following the FIGS. 14-16 processing to continue the processing or connection with higher layers to be formed on the substrate, for example to storage capacitors for the DRAM array.

Figure 1:
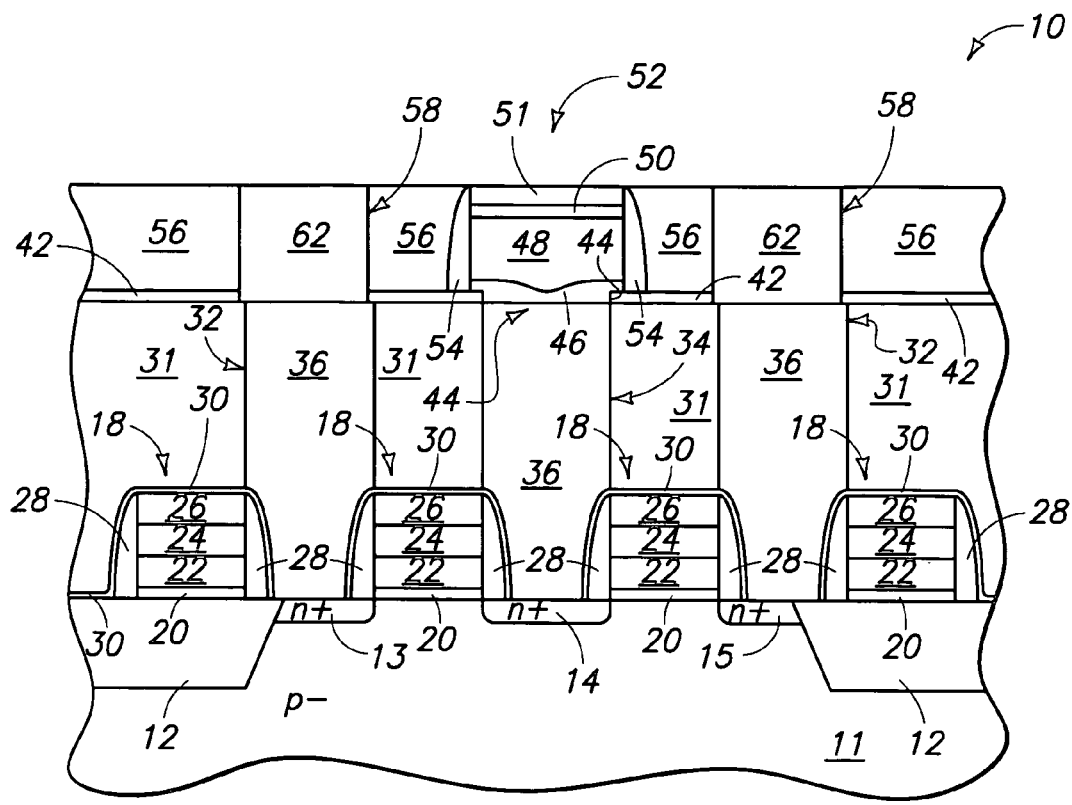
FIGS. 1-3 are diagrammatic depictions of a prior art substrate processed in accordance with prior art methods.
Figure 2:
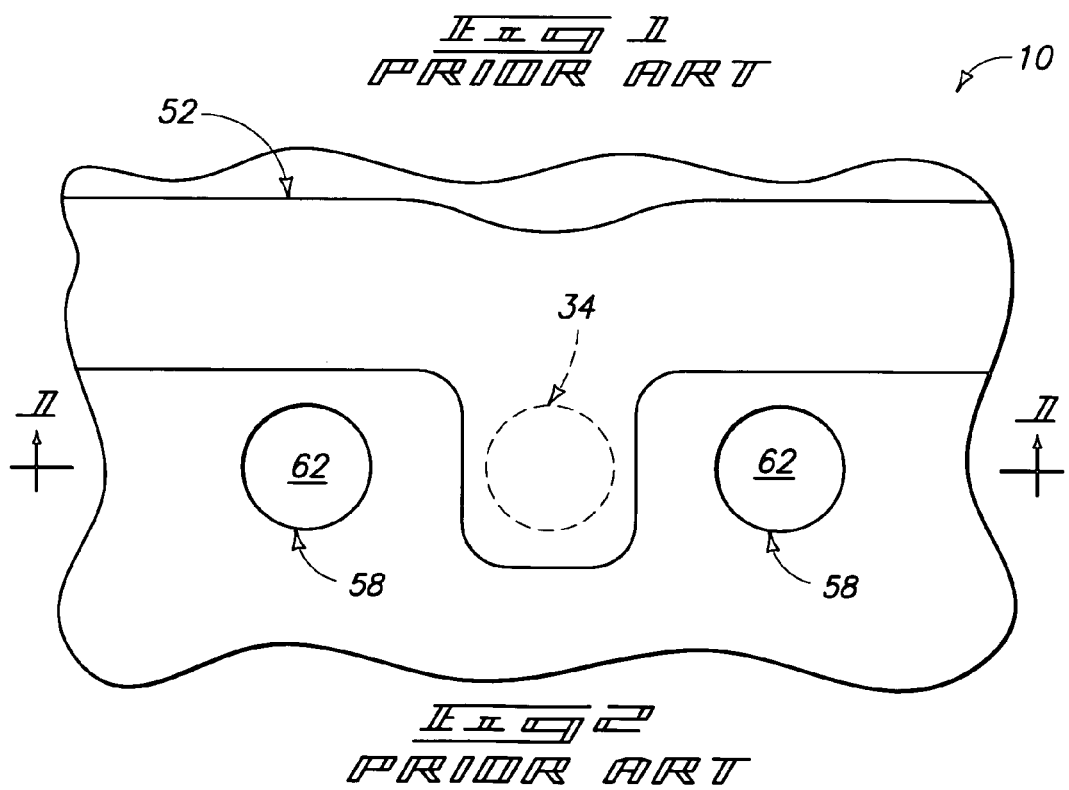
Figure 3:
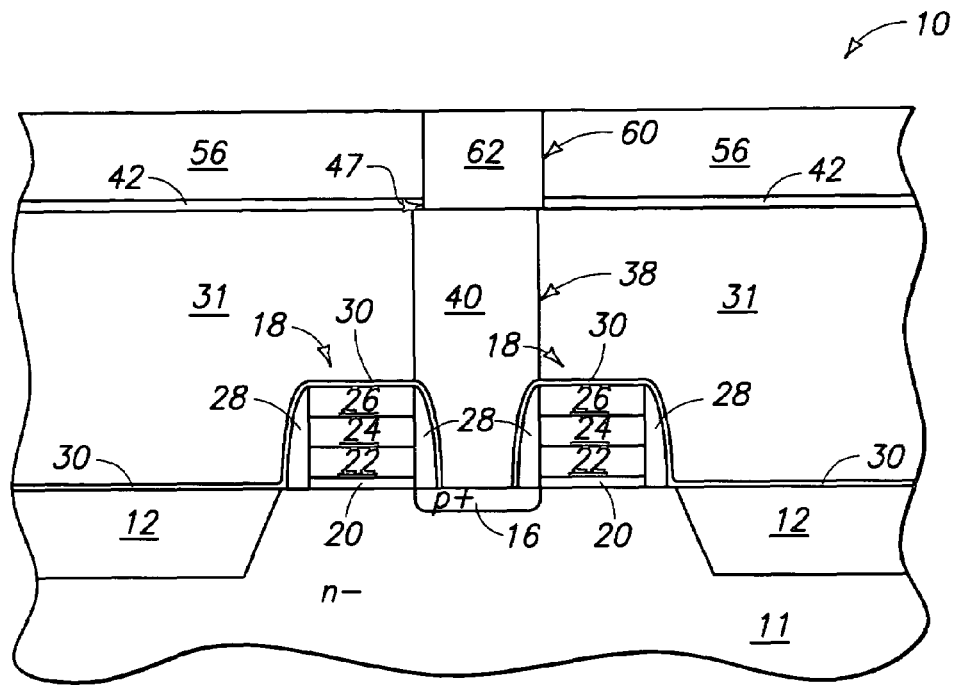

The above-described preferred FIGS. 14-16 embodiment is functionally equivalent to that depicted by FIGS. 1-3 and can be a simplification thereof.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming buried bit line DRAM circuitry comprising:
   forming an insulative mass over a semiconductor substrate;
   in a first masking step, forming a plurality of via openings through the insulative mass to conductive node locations, at least one of the conductive node locations being a memory array bit line node, at least one of the conductive node locations being a memory array storage node;
   after forming the plurality of via openings, in a second masking step forming at least one buried bit line-forming trench within the insulative mass, the buried bit line-forming trench overlying the one via to the memory array bit line node;
   depositing conductive material to within the buried bit line-forming trench, the one via to the memory array bit line node, and the one via to the memory array storage node effective to form a conductively interconnected mass of conductive material which comprises a bit line in the buried bit line-forming trench, a contact to the memory array storage node, and a contact to the bit line node; the depositing comprising depositing conductive elemental titanium, a conductive nitrogen-containing compound, and conductive elemental tungsten into said buried bit line-forming trench, said one via to the memory array bit line node, and said one via to the memory array storage node, said conductively interconnected mass having an outer region comprising the elemental titanium, nitrogen-containing compound, and elemental tungsten; and
   removing a quantity of the outer region including some of each of the conductive elemental tungsten, the conductive nitrogen-containing compound, and the conductive elemental titanium of the conductively interconnected mass of conductive material at least to the insulative mass effective to electrically isolate the bit line from the contact to the memory array storage node.

2. The method of claim 1 wherein the first and second masking steps comprise photolithography and etch.

3. The method of claim 1 wherein all conductive material provided within the buried bit line-forming trench, the bit line via extending from the buried bit line-forming trench, and the memory array storage node via consists essentially of metal to form conductive plugs and the bit line to consist essentially of metal.

4. The method of claim 1 wherein the removing comprises polishing.

5. The method of claim 1 wherein the removing comprises chemical mechanical polishing.

6. The method of claim 1 comprising planarizing the insulative mass.

7. The method of claim 1 comprising chemical mechanical polishing the insulative mass.

8. The method of claim 1 comprising chemical mechanical polishing the insulative mass, and wherein the removing comprises chemical mechanical polishing.

9. The method of claim 1 wherein the insulative mass comprises silicon dioxide.

10. The method of claim 9 wherein the insulative mass comprises doped silicon dioxide.

11. The method of claim 9 wherein the insulative mass comprises undoped silicon dioxide.

12. The method of claim 9 wherein the insulative mass comprises doped and undoped silicon dioxide.

13. A method of forming buried bit line DRAM circuitry comprising:
    depositing an undoped silicon dioxide-comprising layer over a semiconductor substrate;
    depositing a doped silicon dioxide-comprising layer over the undoped silicon dioxide-comprising layer;
    after depositing the doped silicon dioxide-comprising layer, planarizing the doped silicon dioxide-comprising layer;
    in a first photolithographic masking step, etching a plurality of via openings through the doped silicon dioxide-comprising layer and through the undoped silicon dioxide-comprising layer to conductive node locations, at least one of the conductive node locations being a memory array bit line node, at least one of the conductive node locations being a memory array storage node;
    after forming the plurality of via openings, in a second photolithographic masking step forming at least one buried bit line-forming trench within the doped silicon dioxide-comprising layer, the buried bit line-forming trench overlying the one via to the memory array bit line node;
    depositing conductive material to within the buried bit line-forming trench, the one via to the memory array bit line node, and the one via to the memory array storage node effective to form a conductively interconnected mass of conductive material which comprises a bit line in the buried bit line-forming trench, a contact to the memory array storage node, and a contact to the bit line node; the depositing comprising depositing conductive elemental titanium, a conductive nitrogen-containing compound, and conductive elemental tungsten into said buried bit line-forming trench, said one via to the memory array bit line node, and said one via to the memory array storage node, said conductively interconnected mass having an outer region comprising the elemental titanium, nitrogen-containing compound, and elemental tungsten; and
    chemical mechanical polishing a quantity of the outer region including some of each of the conductive elemental tungsten, the conductive nitrogen-containing compound, and the conductive elemental titanium of the conductively interconnected mass of conductive material at least to the doped silicon dioxide-comprising layer effective to electrically isolate the bit line from the contact to the memory array storage node.

14. The method of claim 13 wherein the planarizing comprises chemical mechanical polishing.

15. The method of claim 13 wherein depositing the undoped silicon dioxide-comprising layer comprises decomposition of TEOS.

16. The method of claim 13 wherein the doped silicon dioxide-comprising layer comprises phosphorus.

17. The method of claim 13 wherein the doped silicon dioxide-comprising layer comprises boron.

18. The method of claim 13 wherein the doped silicon dioxide-comprising layer comprises boron and phosphorus.

19. A method of forming buried bit line DRAM circuitry comprising:
    depositing an undoped silicon dioxide-comprising layer over a semiconductor substrate by decomposition of TEOS;
    depositing a silicon dioxide-comprising layer doped with at least one of boron or phosphorus over the undoped silicon dioxide-comprising layer;
    after depositing the doped silicon dioxide-comprising layer, chemical mechanical polishing the doped silicon dioxide-comprising layer;
    in a first photolithographic masking step, etching a plurality of via openings through the doped silicon dioxide-comprising layer and through the undoped silicon dioxide-comprising layer to conductive node locations, at least one of the conductive node locations being a memory array bit line node, at least one of the conductive node locations being a memory array storage node;
    after forming the plurality of via openings, in a second photolithographic masking step forming at least one buried bit line-forming trench within the doped silicon dioxide-comprising layer, the buried bit line-forming trench overlying the one via to the memory array bit line node;
    depositing conductive material to within the buried bit line-forming trench, the one via to the memory array bit line node, and the one via to the memory array storage node effective to form a conductively interconnected mass of conductive material which comprises a bit line in the buried bit line-forming trench, a contact to the memory array storage node, and a contact to the bit line node; the depositing comprising depositing conductive elemental titanium, a conductive nitrogen-containing compound, and conductive elemental tungsten into said buried bit line-forming trench, said one via to the memory array bit line node, and said one via to the memory array storage node, said conductively interconnected mass having an outer region comprising the elemental titanium, nitrogen-containing compound, and elemental tungsten; and
    chemical mechanical polishing a quantity of the outer region including some of each of the conductive elemental tungsten, the conductive nitrogen-containing compound, and the conductive elemental titanium of the conductively interconnected mass of conductive material at least to the doped silicon dioxide-comprising layer effective to electrically isolate the bit line from the contact to the memory array storage node.

20. The method of claim 19 wherein the doped silicon dioxide-comprising layer comprises boron and phosphorus.

* * * * *